US007550690B2

(12) United States Patent
Shimizu et al.

(10) Patent No.: US 7,550,690 B2
(45) Date of Patent: Jun. 23, 2009

(54) ELECTRIC-CIRCUIT-CONTAINING BOX

(75) Inventors: Keiichi Shimizu, Kasugai (JP); Hideyo Kakuno, Tajimi (JP)

(73) Assignee: OMRON Corporation, Kyoto (JP)

( * ) Notice: Subject to any disclaimer, the term of this patent is extended or adjusted under 35 U.S.C. 154(b) by 827 days.

(21) Appl. No.: 11/252,059

(22) Filed: Oct. 17, 2005

(65) Prior Publication Data
US 2006/0087500 A1 Apr. 27, 2006

(30) Foreign Application Priority Data
Oct. 21, 2004 (JP) ............................. 2004-307390

(51) Int. Cl.
*H01H 9/00* (2006.01)
(52) U.S. Cl. ..................... 200/293; 200/295
(58) Field of Classification Search ............. 200/5 A, 200/512–517, 600, 61.41–61.44, 85 R, 86 R, 200/86 A, 85 A; 174/50, 520, 559–561, 563
See application file for complete search history.

(56) References Cited

U.S. PATENT DOCUMENTS

| 4,196,322 | A | | 4/1980 | Hatori | |
|---|---|---|---|---|---|
| 5,181,603 | A | * | 1/1993 | Mori et al. | ............... 200/302.1 |
| 5,824,981 | A | | 10/1998 | Suzuki | |
| 7,397,006 | B2 | * | 7/2008 | Miyauchi | ..................... 200/339 |

FOREIGN PATENT DOCUMENTS

| CN | 1343416 | 4/2002 |
|---|---|---|
| DE | 198 12 249 C1 | 9/1999 |
| DE | 199 61 728 C1 | 8/2001 |
| JP | 7-42537 | 8/1995 |
| JP | 9-265851 | 10/1997 |
| JP | 2001-210190 | 8/2001 |
| WO | WO-00/56040 | 9/2000 |

OTHER PUBLICATIONS

European Search Report dated Jan. 13, 2006.
Japanese Office Action "Notification of Reasons for Refusal" issued in Japanese Application No. 2004-307390 mailed on May 15, 2007 and English translation thereof, 7 pages.
Chinese Office Action issued in Chinese Application No. 2005101128910 mailed on Apr. 20, 2007, 5 pages.
English partial translation of Japanese patent publication 2001-210190, 4 pages Aug. 3, 2001.

* cited by examiner

*Primary Examiner*—Michael A Friedhofer
(74) *Attorney, Agent, or Firm*—Osha • Liang LLP (57) ABSTRACT

In an electric-circuit-containing box including an upper case having a side provided with a hole and a lower case having a side provided with a projection to be fitted in the hole, moisture is prevented from entering the box from the hole of the upper case by a capillary phenomenon. A recess separate from an inside surface of an upper case is provided around a projection of a side of a lower case. Thus, a specified interval is ensured between the periphery of the projection of the side of the lower case and the hole of the upper case. Accordingly, even if moisture attached to an upper part of the upper case flows to the vicinity of the hole 1*b* along an outside surface of the upper case, there does not occur a state that the moisture passes through between both the cases from the hole by the capillary phenomenon and enters inner spaces of both the cases and in which a board and electronic parts are contained.

22 Claims, 9 Drawing Sheets

ELECTRIC-CIRCUIT-CONTAINING BOX

BACKGROUND OF THE INVENTION

1. Field of the Invention

The present invention relates to a waterproof structure of an electric-circuit-containing box for containing an electric circuit including electronic parts, a board and the like.

2. Related Art

A power window switch to open/close a window is provided in an arm rest of a door of an automobile, an inside wall surface of the door, or the like. In general, the power window switch includes an operation button to be operated by hand, a detection switch whose electrical state is switched according to the operation state of the operation button, and the like. The detection switch is mounted on a board on which a circuit is formed. The board, the detection switch and the like are disposed in a box including an upper case and a lower case. The operation button is disposed on the upper case. The box is fixed to the inside of the arm rest or the like so that the operation button protrudes from the arm rest of the door or the like.

Among boxes as described above, some box is assembled such that as disclosed in, for example, JP-A-2001-210190 (patent document 1) and JP-A-9-265851(patent document 2) mentioned below, a projection provided on a side of a lower case is fitted into a hole provided in a side of an upper case. In such a box, when moisture attaches to the surface of the power window switch as a result of opening, for example, the door or window at the time of rain, there is a possibility that the moisture flows down from an upper part of the upper case and enters the box through the hole of the side of the upper case by a capillary phenomenon. In the case where the moisture having entered the box is attached to the detection switch, the board or the like, there occurs a problem that a contact of the detection switch, a pattern of the board, and a resist are damaged (short-circuit, corrosion, burnout, peeling or the like). As a result, the power window switch goes wrong.

Then, in order to solve the problem as stated above, in patent document 2, a rib is provided on the side of the upper case so as to surround the hole, and the moisture flowing down from the upper part of the upper case is guided downward by the rib and is drained.

However, in the foregoing structure of patent document 2, in the case where the amount of moisture flowing down from the upper part of the upper case is large so that it gets over the rib, since the moisture flows to the vicinity of the hole of the upper case, there is a possibility that it enters the box from the hole by the capillary phenomenon.

SUMMARY OF THE INVENTION

The object of an invention is to prevent moisture from entering the box from the hole of the upper case by the capillary phenomenon, in an electric-circuit-containing box including an upper case having a side provided with a hole and a lower case having a side provided with a projection to be fitted in the hole.

According to an invention, in an electric-circuit-containing box including an upper case having a side provided with a hole and a lower case having a side provided with a projection to be fitted in the hole, a recess separate from the side of the upper case is provided around the projection of the side of the lower case. By doing so, since a specified interval is ensured between the periphery of the projection of the side of the lower case and the hole of the upper case, even if moisture attached to the surface of the box flows to the vicinity of the hole along the outside surface of the upper case, it is possible to prevent the moisture from passing through between both the cases and entering the box from the hole by the capillary phenomenon.

Besides, in an embodiment of the invention, a size of the recess is larger than a diameter of the hole of the upper case. By doing so, since the specified interval is certainly ensured between the periphery of the projection of the side of the lower case and the periphery of the hole of the side of the upper case, it is possible to more certainly prevent the moisture from passing through between both the cases and entering the box from the hole by the capillary phenomenon.

Besides, in an embodiment of the invention, the recess is separate from the side of the upper case by an interval exceeding 0.5 mm. In general, the capillary phenomenon occurs in a gap of 0.5 mm or less, and moisture permeates. However, by adopting the above, since the interval between the periphery of the projection of the side of the lower case and the hole of the upper case becomes larger than 0.5 mm, it is possible to certainly prevent the capillary phenomenon from occurring between both the cases at the periphery of the projection.

Besides, in an embodiment of the invention, the recess extends to reach a lower surface of the lower case. By doing so, even if moisture enters the recess of the lower case from the hole of the upper case, the moisture can be drained downward from the lower case.

Besides, in an embodiment of the invention, a stepped part separate from the side of the upper case is provided at a lower end part of the side of the lower case over a whole circumference of the lower case. By doing so, since a specified interval is ensured over the whole circumference between the lower end part of the side of the lower case and the side of the upper case, even if moisture flows to the lower end part of the upper case, it is possible to prevent that the moisture goes around a lower part of the upper case, passes through between both the cases and enters the box by the capillary phenomenon. Besides, even if moisture enters to reach the vicinity of the lower end part of the lower case, the moisture is collected in the stepped part and can be drained downward from the lower case.

Besides, in an embodiment of the invention, an inclined part inclined to go away from the side of the upper case in a downward direction is provided at the lower end part of the side of the lower case over the whole circumference of the lower case or most of the whole circumference. By doing so, since the interval between the lower end part of the side of the lower case and the side of the upper case becomes large toward a lower part over the whole circumference or most of the whole circumference, even if moisture flows to the lower end part of the upper case, it is possible to prevent that the moisture goes around the lower part of the upper case, passes through between both the cases and enters the box by the capillary phenomenon. Besides, even if moisture enters to reach the vicinity of the lower end part of the lower case, the moisture can be easily drained downward from the lower case along the inclined part.

Further, in an embodiment of the invention, a receiving part by which a board provided with an electric circuit is received and its lower surface is separate from an upper surface of the lower case is provided at the lower case. By doing so, even if moisture enters a space between the sides of both the cases, or between the upper case and the recess of the lower case, it is possible to certainly prevent the moisture from attaching to the lower surface of the board by the capillary phenomenon.

According to the invention, the side around the projection of the lower case is recessed as compared with the side of the upper case, so that the interval between the side of the upper case and the side around the projection of the lower case becomes wide. Thus, even if moisture attached to the surface of the box flows to the vicinity of the hole along the outside surface of the upper case, it is possible to prevent the moisture from passing through between the sides of both the cases and from entering the box from the hole by the capillary phenomenon.

DESCRIPTION OF PREFERRED EMBODIMENTS

Figure 1:
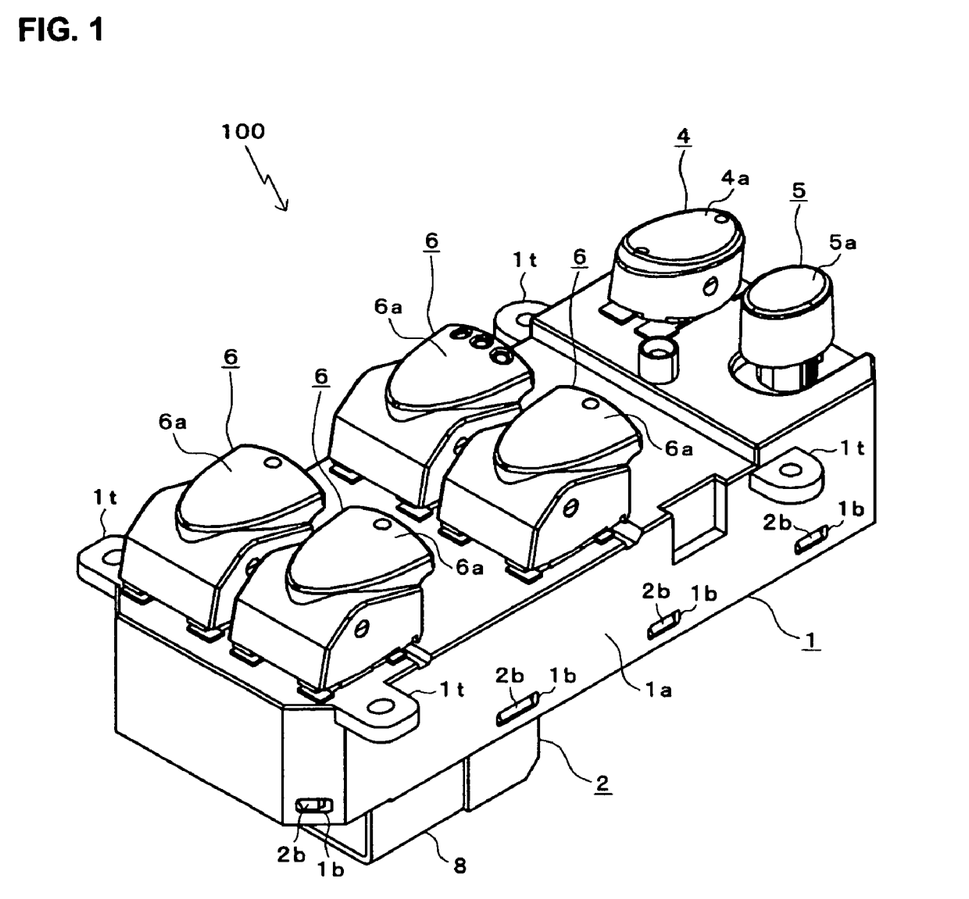
FIG. 1 shows a perspective view of a switch module according to an embodiment.
Figure 2:
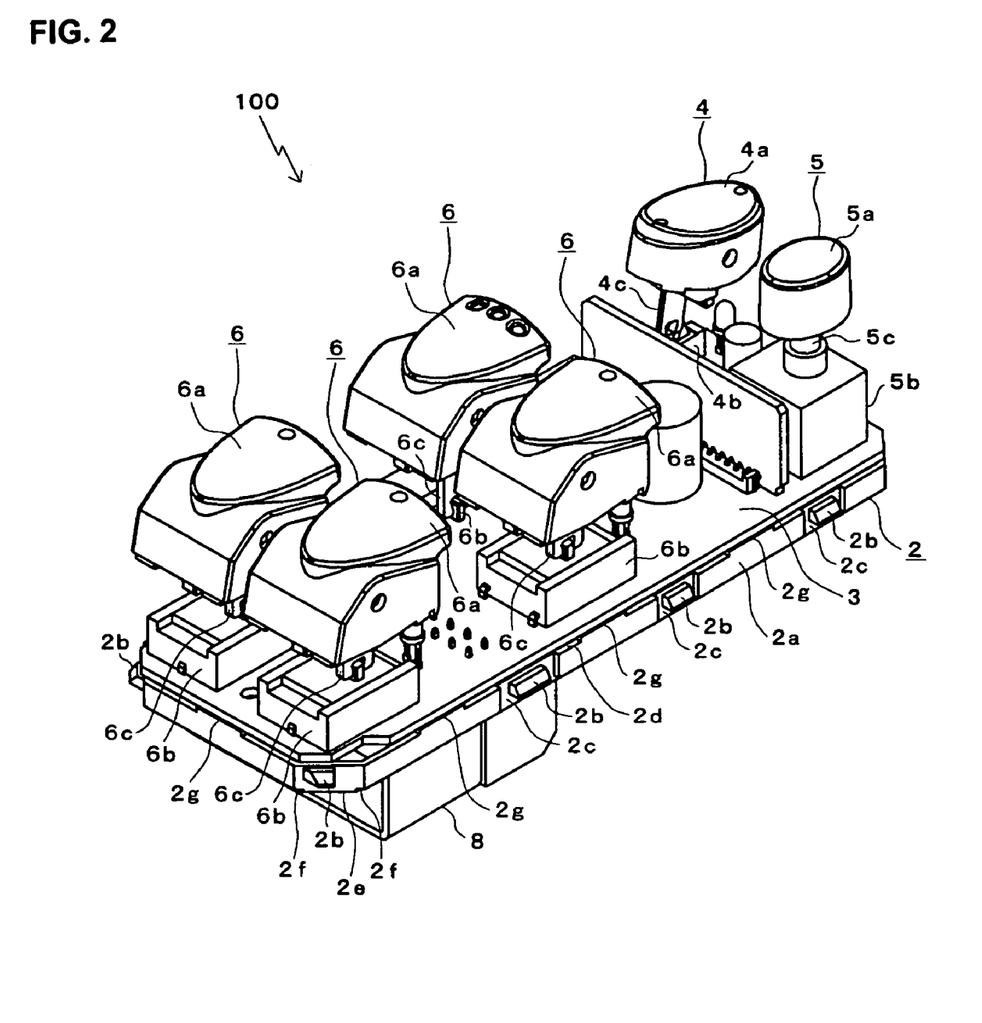
FIG. 2 shows a perspective view in which illustration of an upper case of the switch module is omitted.
Figure 3:
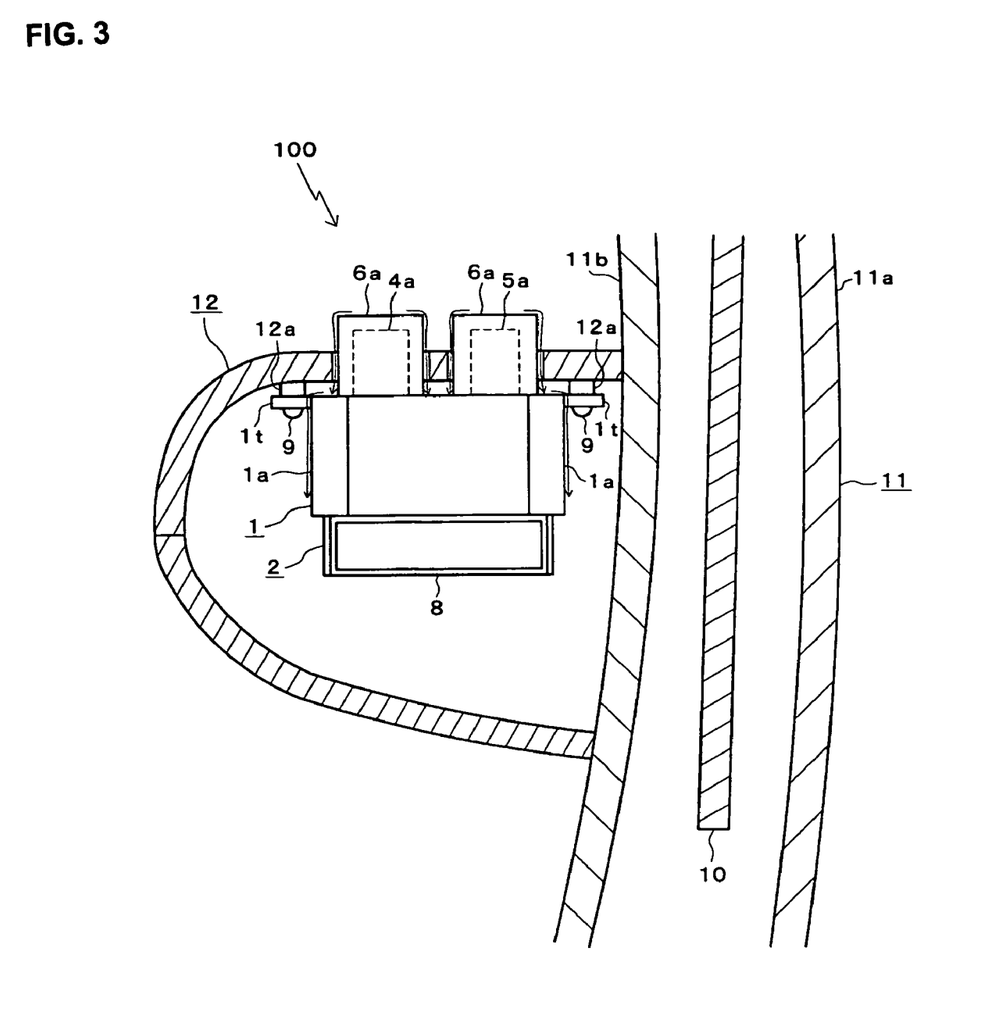
FIG. 3 shows a view showing an attachment state of the switch module.
Figure 4:
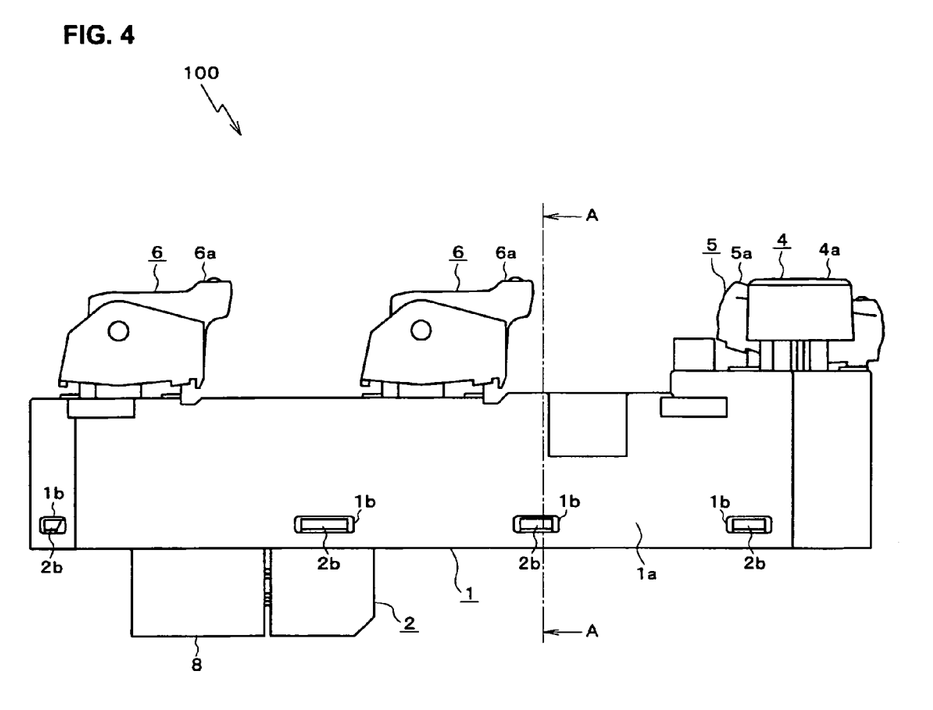
FIG. 4 shows a side view of the switch module.
Figure 5:
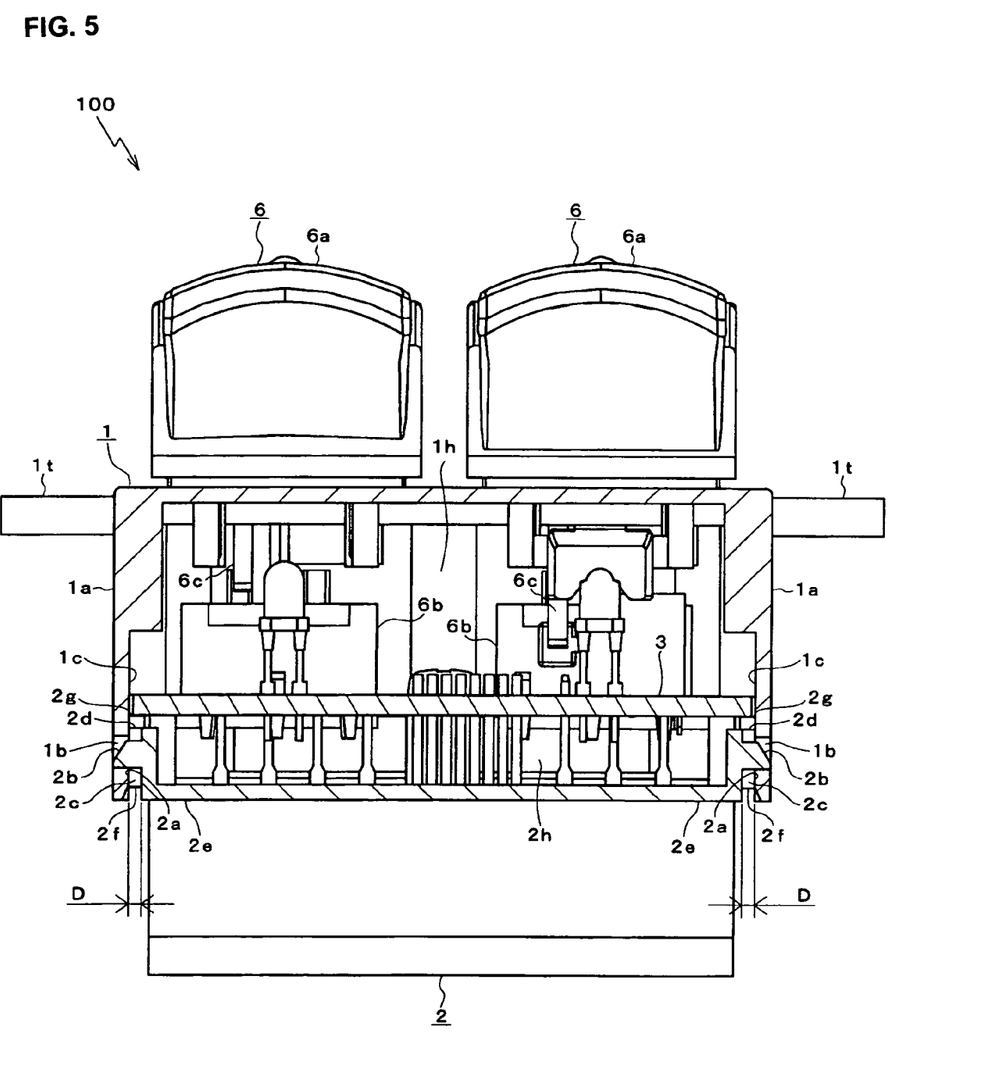
FIG. 5 shows a sectional view of the switch module.
Figure 6:
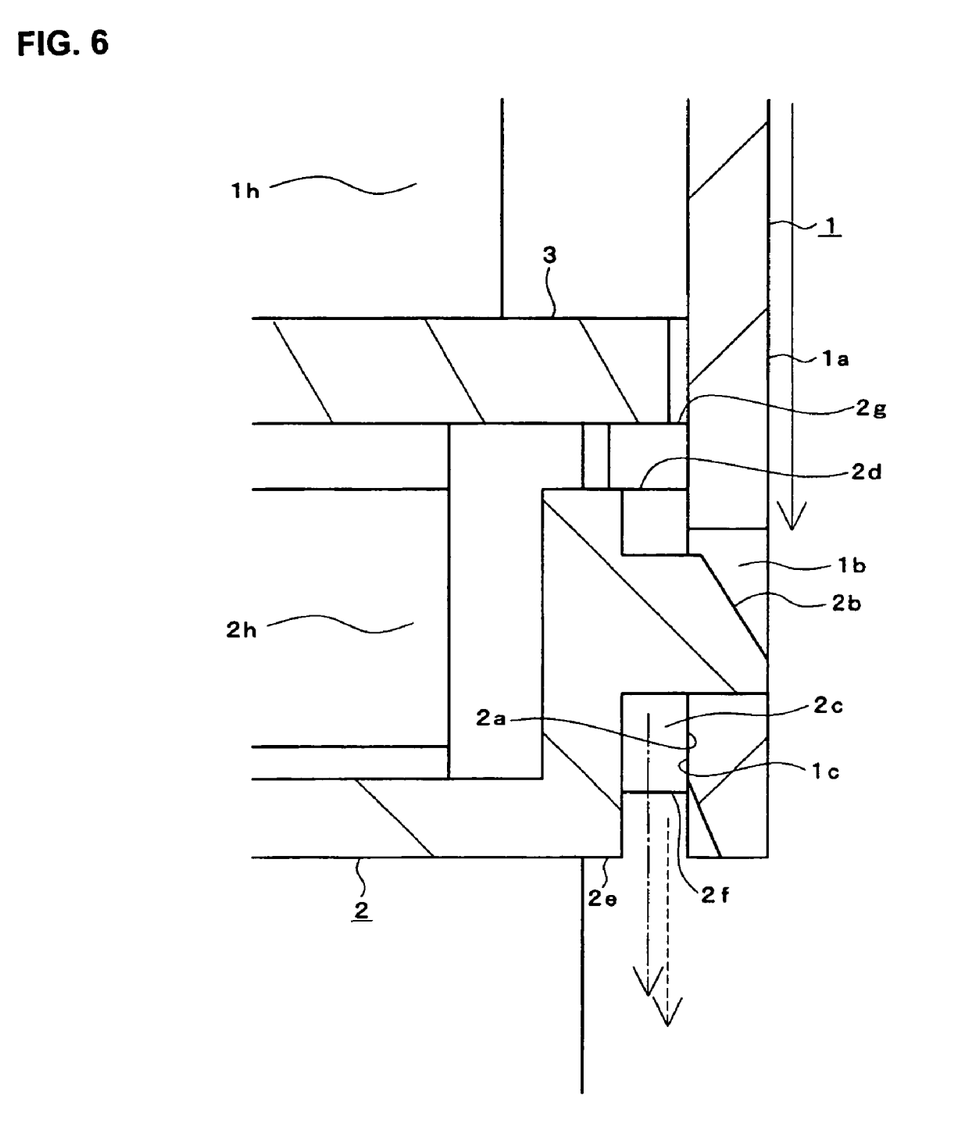
FIG. 6 shows a main part enlarged view of the switch module.
Figure 7:
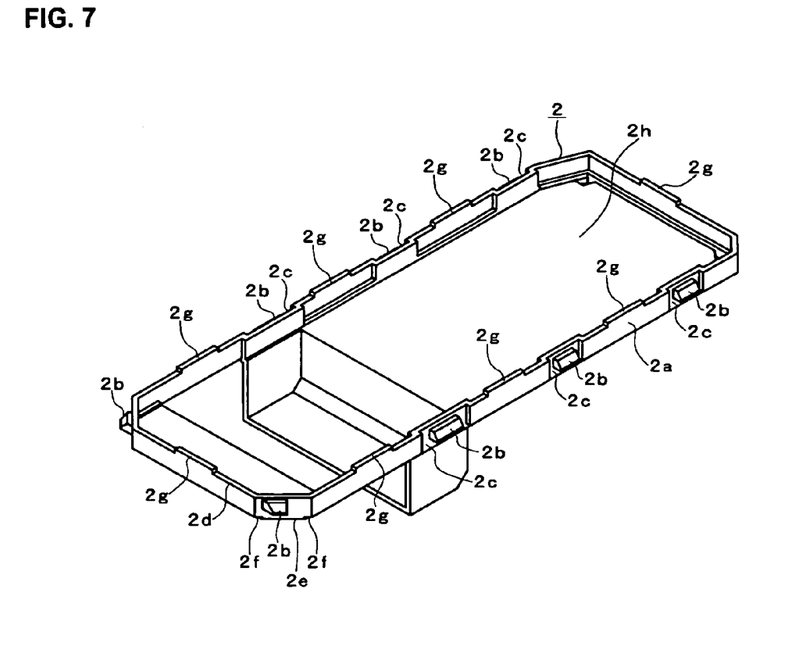
FIG. 7 shows a perspective view of a lower case of the switch module.
Figure 8:
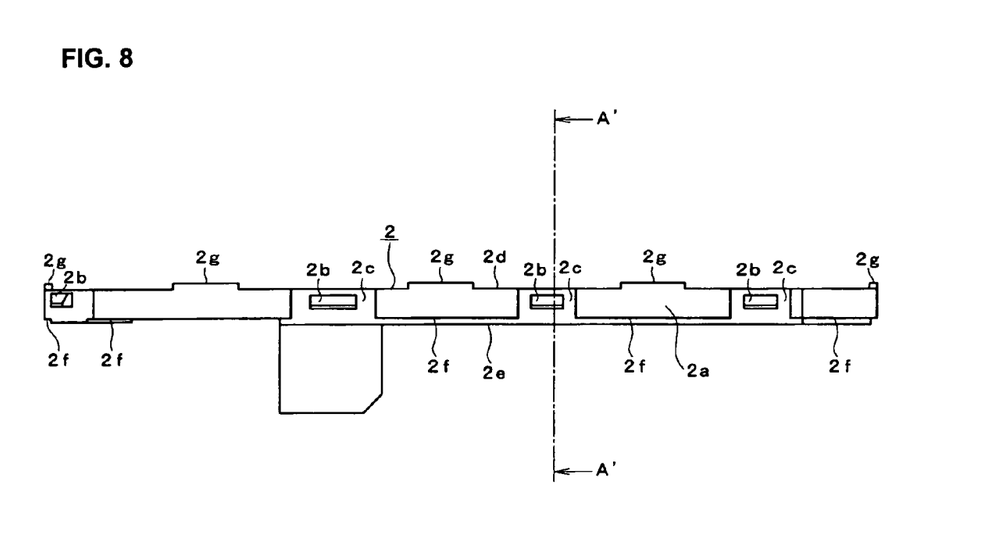
FIG. 8 shows a side view of the lower case of the switch module.
Figure 9:
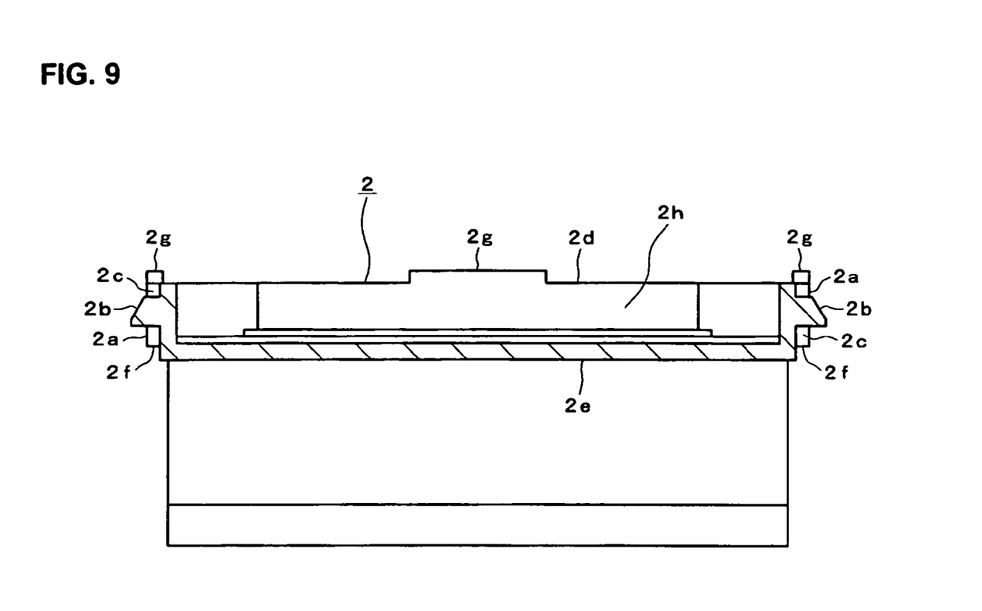
FIG. 9 shows a sectional view of the lower case of the switch module.

FIGS. 1 to 6 are views showing a switching module of an embodiment. Particularly, FIG. 1 is a perspective view of a switch module. FIG. 2 is a perspective view in which illustration of an upper case is omitted in the switch module. FIG. 3 is a view showing an attachment state of the switch module. FIG. 4 is a side view of the switch module. FIG. 5 is a sectional view (sectional view along A-A of FIG. 4) of the switch module. FIG. 6 is an enlarged view of a main part (lower right portion of FIG. 5) of the switch module. FIGS. 7 to 9 are views showing a lower case of the switch module. Particularly, FIG. 7 is a perspective view of the lower case. FIG. 8 is side view of the lower case. FIG. 9 is a sectional view (sectional view along A'-A' of FIG. 8) of the lower case.

Reference numeral 100 indicated in FIG. 1 denotes an in-vehicle switch module. Reference numeral 1 denotes an upper case of the switch module 100, and 2 indicated in FIG. 2 denotes a lower case of the switch module 100. As shown in FIG. 5, a board 3 on which a circuit is formed and electronic parts mounted on the board 3 are contained in inner spaces 1h and 2h surrounded by the upper and the lower cases 1 and 2. The upper case 1 and the lower case 2 constitute one embodiment of an electric-circuit-containing box of the invention. An attachment part 1t is provided at an upper part of a side 1a of the upper case 1. As shown in FIG. 3, after a screw 9 is made to pass through the attachment part 1t, it is screwed into an attachment part 12a of an arm rest 12 provided on a door 11 of a driver's seat of an automobile, so that the switch module 100 is attached to the arm rest 12. Reference numeral 11a of FIG. 3 denotes an outer wall of the door 11; 11b, an inner wall of the door 11; and 10, a window of the driver's seat contained in the door 11.

Reference numeral 8 indicated below in FIG. 1 and FIG. 2 denotes a connector mounted on the board 3 so as to protrude from the lower case 2. A cable to perform communication with a not-shown control device is connected to this connector 8. Reference numeral 4 denotes a door lock switch, and is operated to perform locking so that the respective doors of the automobile are not opened, or to release the locking. The door lock switch 4 is a seesaw-type button switch, and includes an operation button 4a disposed on the upper case 1, a detection switch 4b mounted on the board 3, a lever 4c coupled to the operation button 4a and the detection switch 4b, and the like. Reference numeral 5 denotes a window lock switch, and is operated to perform locking so that the respective windows of the automobile can not be opened/closed or to release the locking. The window lock switch 5 is a lock-type button switch, and includes an operation button 5a disposed on the upper case 1, a contact switch 5b mounted on the board 3 and to cut a large current, and the like. Reference numeral 5c denotes a knob of the contact switch 5b coupled to the operation button 5a. Reference numeral 6 denotes a power window switch, and is operated to open/close each window of the automobile. The power window switch 6 is a seesaw-type button switch, and includes an operation button 6a disposed on the upper case 1, a detection switch 6b mounted on the board 3, a lever 6c coupled to the operation button 6a and the detection switch 6b, and the like. As shown in FIG. 3, in the state where the switch module 100 is attached to the arm rest 12, the operation buttons 4a to 6a of the respective switches 4 to 6 protrude upward from the arm rest 12, and can be operated by hand.

As shown in FIGS. 1 and 2, plural holes 1b are provided in a lower part of the side 1a of the upper case 1, and plural projections 2b are provided on the side 2a of the lower case 2. In FIGS. 1 and 2, although only the holes 1b and the projections 2b provided on the sides 1a and 2a of both the cases 1 and 2 on this side are shown, holes 1b and projections 2b are similarly provided also on the sides 1a and 2a of both the cases 1 and 2 on the back side. As shown in FIGS. 1, 4 and 5, the respective projections 2b of the lower case 2 are fitted in the respective holes 1b of the upper case 1 and are locked together, so that the upper and the lower cases 1 and 2 are assembled.

In the assembly state of the upper and the lower cases 1 and 2, as shown in FIGS. 5 and 6, an inside surface 1c of the upper case 1 and a side 2a of the lower case 2 are close to each other so that a gap is hardly formed. This prevents dust from entering the inner spaces 1h and 2h of both the cases 1 and 2 and the lower case 2 from wobbling relative to the upper case 1. As shown in FIG. 2 and FIGS. 7 to 9, a recess 2c is provided around the projection 2b of the side 2a of the lower case 2. Thus, in the assembly state of the cases 1 and 2, as shown in FIG. 5, the bottom of the recess 2c and the inside surface 1c of the upper case 1 are separate from each other by a specified interval D. In consideration of a fact that the capillary phenomenon generally occurs in a gap of 0.5 mm or less, the specified interval D is set to a value exceeding 0.5 mm, for example, about 1 mm slightly smaller than the thickness of both the cases 1 and 2. As is apparent from the comparison between FIGS. 4 and 8, the size of the recess 2c (recessed range) is larger than the diameter of the hole 1b (size of the hole 1b) of the upper case 1. Besides, the recess 2c extends to reach an upper surface 2d and a lower surface 2e of the lower case 2.

As shown in FIGS. 7 to 9, a stepped part 2f separate from the inside surface 1c of the upper case 1 is provided at a lower end part of the side 2a of the lower case 2 over the whole circumference of the lower case 2. The stepped part 2f communicates with the recess 2c. Thus, in the assembly state of the upper and the lower cases 1 and 2, as shown in FIGS. 5 and 6, the bottom of the stepped part 2f and the inside surface 1c of the upper case 1 are separate from each other by the specified interval D. As shown in FIGS. 7 to 9, receiving parts 2g protruding upward are provided on the upper surface 2d of the lower case 2. As shown in FIGS. 2, 5 and 6, the lower case 2 receives the board 3 so that the lower surface thereof is separate from the upper surface 2d of the lower case 2 by this receiving part 2g.

According to the foregoing structure, since the recess 2c is provided around the projection 2b of the side 2a of the lower case 2, the specified interval D can be ensured between the periphery of the projection 2b of the side 2a of the lower case 2 and the hole 1b of the upper case 1. Thus, even if moisture attached to the surfaces of the operation buttons 4a to 6a of the switches 4 to 6 by the opening of the door 11 or the window 10 at the time of rain flows down to an upper part of the upper case 1 as indicated by an arrow of a solid line of FIG. 3, and further flows to the vicinity of the hole 1b along the outside surface 1a of the upper case 1 as indicated by the arrow of the solid line in FIGS. 3 and 6, it is possible to prevent that the moisture is sucked from the hole 1b into between both the cases 1 and 2 by the capillary phenomenon, passes through therebetween and enters the inner spaces 1h and 2h of both the cases 1 and 2 in which the board 3 and the electronic parts are contained. As a result, it becomes possible to prevent that the moisture is attached to the inside switches 4b to 6b and the board 3, so that the contacts of the respective switches 4b to 6b, the pattern of the board 3 and the resist are damaged (short circuit, corrosion, burnout, peeling and the like) and the respective switches 4 to 6 go wrong.

Besides, since the size of the recess 2c is larger than the diameter of the hole 1b of the upper case 1, the specified interval D can be certainly ensured between the periphery of the projection 2b of the side 2a of the lower case 2 and the periphery of the hole 1b of the inside surface 1c of the upper case 1. Thus, it becomes possible to further certainly prevent moisture from passing through between both the cases 1 and 2 and from entering the inside spaces 1h and 2h from the hole 1b by the capillary phenomenon. Besides, as shown in FIG. 7, although the width of the inner space 2h of the lower case 2 becomes narrow by providing the recess 2c, since the recess 2c is provided only around the projection 2b, the whole width of the inner space 2h does not become wastefully narrow, and the size of parts to be contained in the inner space 2h and the size of the mounting area of the board 3 are not restricted.

Besides, the capillary phenomenon generally occurs in a gap of 0.5 mm or less and moisture permeates. Since the specified interval D is set to a value larger than 0.5 mm, it is possible to certainly prevent the capillary phenomenon from occurring between the upper case 1 and the lower case 2 at the peripheries of the projection 2b and the hole 1b. Incidentally, in order to completely prevent the occurrence of capillary phenomenon between the upper case 1 and the lower case 2, it is effective to further enlarge the specified interval D. However, in order to enlarge the specified interval D, the width of the inner space 1h of the upper case 1 must be enlarged, or the depth of the recess 2c of the lower case 2 must be made deep. However, there occurs disadvantage that in the former, the outer widths of the upper case 1 and the switch module 100 become large, and in the latter, the width of the inner space 2h of the lower case 2 becomes narrow. In the above embodiment, since the specified interval D is set to the value (for example, about 1 mm) which has a sufficient margin for the interval (0.5 mm) of the occurrence limit of the capillary phenomenon and is not excessively large relative to the thickness of both the cases 1 and 2, the occurrence of the capillary phenomenon is completely prevented between both the cases 1 and 2 at the peripheries of the projection 2b and the hole 1b, and it is possible to suppress the occurrence of the disadvantage that the switch module 100 and the like become large and the inner space 2h of the lower case 2 becomes narrow.

Besides, since the recess 2c is extended to reach the lower surface 2e of the lower case 2, even if moisture enters the recess 2c from the hole 1b of the upper case 1, the moisture can be drained downward from the lower case 2 as indicated by an arrow of an alternate long and short dash line of FIG. 6.

Besides, since the stepped part 2f is provided at the lower end of the side 2a of the lower case 2 over the whole circumference of the lower case 2, the specified interval D can be ensured between the lower end part of the side 2a of the lower case 2 and the inside surface 1c of the upper case 1 over the whole circumference. Thus, even if moisture flows to the lower end part of the upper case 1, it becomes possible to prevent that the moisture goes around a lower part of the upper case 1, passes through between both the cases 1 and 2 and enters the inner spaces 1h and 2h by the capillary phenomenon. Besides, even if moisture enters to reach the vicinity of the lower end part of the lower case 2, the moisture is collected in the stepped part 2f, and can be drained downward from the lower case 2 as indicated by an arrow of a broken line in FIG. 6.

Further, since the receiving part 2g is provided which receives the board 3 so that the lower surface thereof is separate from the upper surface 2d of the lower case 2, even if moisture enters a space between the sides 1c and 2a of both the cases 1 and 2 or between the upper case 1 and the recess 2c of the lower case 2, it is possible to certainly prevent the moisture from attaching to the lower surface of the board 3 by the capillary phenomenon.

Figure 10:
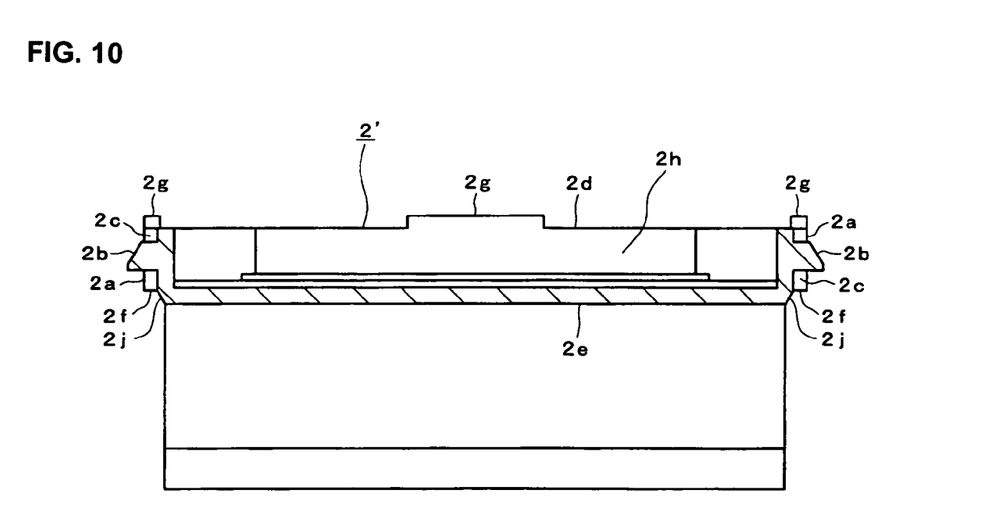
FIG. 10 shows a sectional view of a lower case of another embodiment.
Figure 11:
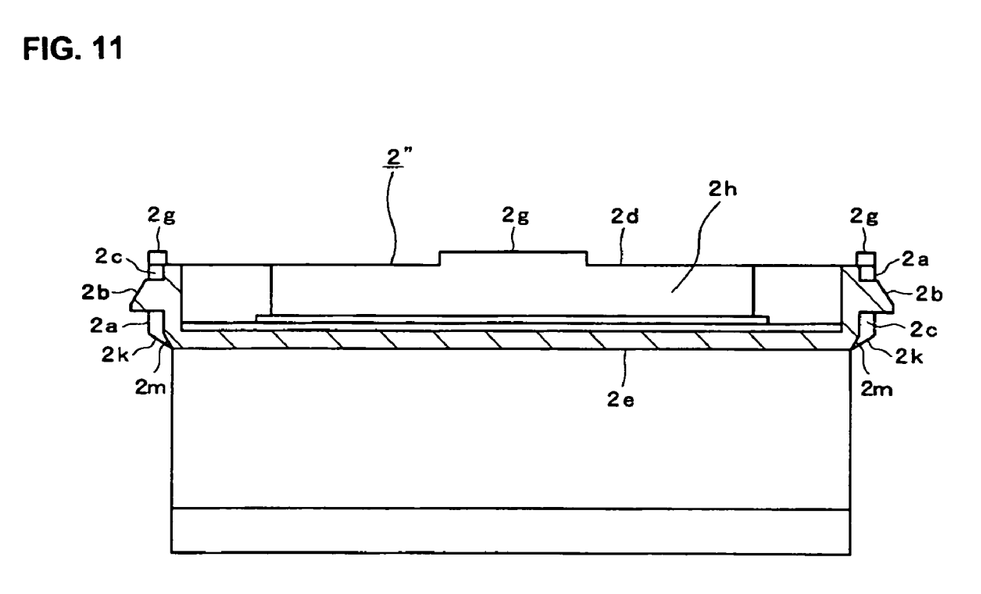
FIG. 11 shows a sectional view of a lower case of another embodiment.

FIGS. 10 and 11 are sectional views of lower cases according to other embodiments. Incidentally, in these drawings, same portions as those shown in FIGS. 1 to 9 are denoted by the same reference numerals. In the embodiment shown in FIG. 10, at a lower end part of a side 2a of a lower case 2', an inclined part 2j which communicates with a stepped part 2f and a lower surface 2e and is inclined downward in a direction (direction toward the center of a lower case 2') of going away from an inside surface 1c (for example, FIG. 5) of an upper case 1 is provided over the whole circumference of the lower case 2'. In the embodiment shown in FIG. 11, at a lower end part of a side 2a of a lower case 2'', instead of the stepped part 2f, an inclined part 2k inclined downward in a direction of going away from an inside surface 1c of an upper case 1 is provided at a portion other than a recess 2c. Besides, an inclined part 2m which communicates with the recess 2c and a lower surface 2e and is inclined downward in a direction of going away from the inside surface 1c of the upper case 1 is provided in the recess 2c.

As stated above, the inclined parts 2j, 2k and 2m are provided at the lower end parts of the sides 2a of the lower cases 2' and 2'' over the whole circumference of the lower cases 2' and 2'' or over most of the whole circumference, and the interval between the lower part of the lower case 2', 2'' and the inside surface 1c of the upper case 1 formed when one of the lower cases 2' and 2'' and the upper case 1 are assembled can be made to become large in a downward direction over the whole circumference or over most of the whole circumference. Thus, even if moisture flows to the lower end part of the upper case 1, it becomes possible to prevent that the moisture goes around a lower part of the upper case 1, passes through between the upper and the lower cases 1, 2', 2'' and enters the inner spaces 1h and 2h by the capillary phenomenon. Besides, even if moisture enters to reach the vicinity of the lower end part of the lower case 2', 2", the moisture can be easily drained downward from the lower cases 2' and 2" along the inclined parts 2j, 2k and 2m.

In the above-described embodiments, although the example in which the invention is applied to the in-vehicle switch module has been described, the invention is not limited to this, but can be applied to a general box containing an electric circuit.

What is claimed is:

1. An electric-circuit-containing box comprising an upper case having a side provided with a hole and a lower case having a side provided with a projection to be fitted in the hole, characterized in that
 a recess separate from the side of the upper case is provided entirely around the projection of the side of the lower case.

2. The electric-circuit-containing box according to claim 1, characterized in that a size of the recess is larger than a diameter of the hole of the upper case.

3. The electric-circuit-containing box according to claim 2, characterized in that the recess is separate from the side of the upper case by an interval exceeding 0.5 mm.

4. The electric-circuit-containing box according to claim 2, characterized in that the recess extends to reach a lower surface of the lower case.

5. The electric-circuit-containing box according to claim 2, characterized in that a stepped part separate from the side of the upper case is provided at a lower end part of the side of the lower case over a whole circumference of the lower case.

6. The electric-circuit-containing box according to claim 2, characterized in that an inclined part inclined to go away from the side of the upper case in a downward direction is provided at a lower end part of the side of the lower case over a whole circumference of the lower case or over most of the whole circumference.

7. The electric-circuit-containing box according to claim 2, characterized in that a receiving part by which a board provided with an electric circuit is received and its lower surface is separate from an upper surface of the lower case is provided at the lower case.

8. The electric-circuit-containing box according to claim 1, characterized in that the recess is separate from the side of the upper case by an interval exceeding 0.5 mm.

9. The electric-circuit-containing box according to claim 8, characterized in that the recess extends to reach a lower surface of the lower case.

10. The electric-circuit-containing box according to claim 8, characterized in that a stepped part separate from the side of the upper case is provided at a lower end part of the side of the lower case over a whole circumference of the lower case.

11. The electric-circuit-containing box according to claim 8, characterized in that an inclined part inclined to go away from the side of the upper case in a downward direction is provided at a lower end part of the side of the lower case over a whole circumference of the lower case or over most of the whole circumference.

12. The electric-circuit-containing box according to claim 8, characterized in that a receiving part by which a board provided with an electric circuit is received and its lower surface is separate from an upper surface of the lower case is provided at the lower case.

13. The electric-circuit-containing box according to claim 1, characterized in that the recess extends to reach a lower surface of the lower case.

14. The electric-circuit-containing box according to claim 13, characterized in that a stepped part separate from the side of the upper case is provided at a lower end part of the side of the lower case over a whole circumference of the lower case.

15. The electric-circuit-containing box according to claim 13, characterized in that an inclined part inclined to go away from the side of the upper case in a downward direction is provided at a lower end part of the side of the lower case over a whole circumference of the lower case or over most of the whole circumference.

16. The electric-circuit-containing box according to claim 13, characterized in that a receiving part by which a board provided with an electric circuit is received and its lower surface is separate from an upper surface of the lower case is provided at the lower case.

17. The electric-circuit-containing box according to claim 1, characterized in that a stepped part separate from the side of the upper case is provided at a lower end part of the side of the lower case over a whole circumference of the lower case.

18. The electric-circuit-containing box according to claim 17, characterized in that an inclined part inclined to go away from the side of the upper case in a downward direction is provided at a lower end part of the side of the lower case over a whole circumference of the lower case or over most of the whole circumference.

19. The electric-circuit-containing box according to claim 17, characterized in that a receiving part by which a board provided with an electric circuit is received and its lower surface is separate from an upper surface of the lower case is provided at the lower case.

20. The electric-circuit-containing box according to claim 1, characterized in that an inclined part inclined to go away from the side of the upper case in a downward direction is provided at a lower end part of the side of the lower case over a whole circumference of the lower case or over most of the whole circumference.

21. The electric-circuit-containing box according to claim 20, characterized in that a receiving part by which a board provided with an electric circuit is received and its lower surface is separate from an upper surface of the lower case is provided at the lower case.

22. The electric-circuit-containing box according to claim 1, characterized in that a receiving part by which a board provided with an electric circuit is received and its lower surface is separate from an upper surface of the lower case is provided at the lower case.

* * * * *